(12) United States Patent
Arjakine et al.

(10) Patent No.: US 9,458,552 B2
(45) Date of Patent: Oct. 4, 2016

(54) SINGLE CRYSTAL WELDING OF DIRECTIONALLY COMPACTED MATERIALS

(75) Inventors: Nikolai Arjakine, Berlin (DE); Georg Bostanjoglo, Berlin (DE); Bernd Burbaum, Falkensee (DE); Andres Gasser, Aachen (DE); Torsten Jambor, Düsseldorf (DE); Torsten Jokisch, Neuenhagen bei Berlin (DE); Stefanie Linnenbrink, Kreuzau (DE); Selim Mokadem, Nürnberg (DE); Michael Ott, Mülheim an der Ruhr (DE); Norbert Pirch, Aachen (DE); Rolf Wilkenhöner, Kleinmachnow (DE)

(73) Assignees: FRAUNHOFER GESELLSCHAFT ZUR FÖRDERUNG DER ANGEWANDTEN FORSCHUNG E.V., München (DE); SIEMENS AKTIENGESELLSCHAFT, München (DE)

(*) Notice: Subject to any disclaimer, the term of this patent is extended or adjusted under 35 U.S.C. 154(b) by 385 days.

(21) Appl. No.: 14/115,940

(22) PCT Filed: Apr. 13, 2012

(86) PCT No.: PCT/EP2012/056739
§ 371 (c)(1),
(2), (4) Date: Jan. 8, 2014

(87) PCT Pub. No.: WO2012/152524
PCT Pub. Date: Nov. 15, 2012

(65) Prior Publication Data
US 2014/0123890 A1 May 8, 2014

(30) Foreign Application Priority Data
May 9, 2011 (EP) .................... 11165301

(51) Int. Cl.
C30B 11/10 (2006.01)
F01D 5/28 (2006.01)
(Continued)

(52) U.S. Cl.
CPC .......... *C30B 11/10* (2013.01); *B23K 26/0006* (2013.01); *B23K 26/32* (2013.01);
(Continued)

(58) Field of Classification Search
CPC ...................................................... C30B 11/04
See application file for complete search history.

(56) References Cited

U.S. PATENT DOCUMENTS
6,024,792 A    2/2000  Bieler

FOREIGN PATENT DOCUMENTS
DE       60312826 T2    1/2008
DE    102009051823 A1    5/2011
(Continued)

OTHER PUBLICATIONS

Gaeumann M et al, "Single-Crystal Laser Deposition of Superalloys Processing-Microstructure Maps", Acta Materialia, Elsevier,Oxford, Bd 49, Nr 6, Apr. 2, 2001, pp. 1051-1062, ISSN 1359-6454, DOI 10 1016/S1359-6454(00)00367-0, XP001018288, Seite 1061, Absatz 4, 2001, GB, Apr. 2, 2001.

*Primary Examiner* — Robert M Kunemund

(57) ABSTRACT

A process for welding directionally solidified metallic materials is presented. Process parameters are targeted selected with respect to laser welding, advancement, laser power beam diameter and powder mass flow. The temperature gradient, which is fundamentally decisive for the single-crystal growth during laser cladding, may be set in a targeted manner.

14 Claims, 5 Drawing Sheets

(51) Int. Cl.
*B23K 26/00* (2014.01)
*B23K 26/32* (2014.01)
*B23K 35/02* (2006.01)

(52) U.S. Cl.
CPC ........ *B23K 26/342* (2015.10); *B23K 35/0244* (2013.01); *F01D 5/28* (2013.01); *B23K 2201/001* (2013.01); *B23K 2203/08* (2013.01); *B23K 2203/50* (2015.10); *F05D 2230/232* (2013.01); *F05D 2230/234* (2013.01); *F05D 2300/605* (2013.01); *F05D 2300/606* (2013.01); *F05D 2300/607* (2013.01)

(56) References Cited

FOREIGN PATENT DOCUMENTS

| | | |
|---|---|---|
| EP | 0486489 B1 | 11/1994 |
| EP | 0412397 B1 | 3/1998 |
| EP | 0861927 A1 | 9/1998 |
| EP | 0892090 A1 | 1/1999 |
| EP | 0786017 61 | 3/1999 |
| EP | 1306454 A1 | 5/2003 |
| EP | 1319729 A1 | 6/2003 |
| EP | 1204776 B1 | 6/2004 |
| WO | WO 9967435 | 12/1999 |
| WO | WO 0044949 | 8/2000 |

FIG 2

| Material | Chemical composition in % | | | | | | | | | | | | | |
|---|---|---|---|---|---|---|---|---|---|---|---|---|---|---|
| | C | Cr | Ni | Co | Mo | W | Ta | Nb | Al | Ti | B | Zr | Hf |
| Ni-based investment casting alloys | | | | | | | | | | | | | |
| GTD 222 | 0.10 | 22.5 | Rem. | 19.0 | | 2.0 | 1.0 | | 1.2 | 2.3 | 0.008 | | |
| IN 939 | 0.15 | 22.4 | Rem. | 19.0 | | 2.0 | 1.4 | 1.0 | 1.9 | 3.7 | 0.009 | 0.10 | |
| IN 6203 DS | 0.15 | 22.0 | Rem. | 19.0 | | 2.0 | 1.1 | 0.8 | 2.3 | 3.5 | 0.010 | 0.10 | 0.75 |
| Udimet 500 | 0.10 | 18.0 | Rem. | 18.5 | 4.0 | | | | | | | 0.05 | |
| IN 738 LC | 0.10 | 16.0 | Rem. | 8.5 | 1.7 | 2.6 | 1.7 | 0.9 | 2.9 | 3.4 | 0.010 | 0.10 | |
| SC 16 | <0.01 | 16.0 | Rem. | | 3.0 | | 3.5 | | 3.5 | 3.5 | <0.005 | <0.008 | |
| Rene 80 | 0.17 | 14.0 | Rem. | 9.5 | 4.0 | 4.0 | | | 3.0 | 5.0 | 0.015 | 0.03 | |
| GTD 111 | 0.10 | 14.0 | Rem. | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Rem. | 9.0 | 1.9 | 4.1 | 4.1 | | 3.4 | 3.8 | 0.015 | 0.02 | |
| IN 792 DS | 0.08 | 12.5 | Rem. | 9.0 | 1.9 | 4.1 | 4.1 | | 3.4 | 3.8 | 0.015 | 0.02 | 1.00 |
| MAR M 002 | 0.15 | 9.0 | Rem. | 10.0 | | 10.0 | 2.5 | | 5.5 | 1.5 | 0.015 | 0.05 | 1.50 |
| MAR M 247 LC DS | 0.07 | 8.1 | Rem. | 9.2 | 0.5 | 9.5 | 3.2 | | 5.6 | 0.7 | 0.015 | 0.02 | 1.40 |
| CMSX-2 | <0.006 | 8.0 | Rem. | 4.6 | 0.6 | 8.0 | 6.0 | | 5.6 | 1.0 | <0.003 | <0.0075 | 0.10 |
| CMSX-3 | <0.006 | 8.0 | Rem. | 4.6 | 0.6 | 8.0 | 6.0 | | 5.6 | 1.0 | <0.003 | <0.0075 | 0.10 |
| CMSX-4 | | 6.0 | Rem. | 10.0 | 0.6 | 6.0 | 6.0 | | 5.6 | 1.0 | <0.0075 | Re=3.0 | 0.10 |
| CMSX-6 | <0.015 | 10.0 | Rem. | 5.0 | 3.0 | <1.0 | 2.0 | | 4.9 | 4.8 | <0.003 | <0.0075 | |
| PWA 1480 SX | <0.006 | 10.0 | Rem. | 5.0 | | 4.0 | 12.0 | | 5.0 | 1.5 | <0.0075 | <0.0075 | |
| PWA 1483 SX | 0.07 | 12.2 | Rem. | 9.0 | 1.9 | 3.8 | 5.0 | | 3.6 | 4.2 | 0.0001 | 0.002 | |
| Co-based investment casting alloys | | | | | | | | | | | | | |
| FSX 414 | 0.25 | 29.0 | 10 | Rem. | | 7.5 | | | | | 0.010 | | |
| X 45 | 0.25 | 25.0 | 10 | Rem. | | 8.0 | | | | | 0.010 | | |
| ECY 768 | 0.65 | 24.0 | 10 | 51.7 | | 7.5 | 4.0 | | 0.25 | 0.3 | 0.010 | 0.05 | |
| MAR M 509 | 0.65 | 24.5 | 11 | Rem. | | 7.5 | 4 | | | 0.3 | 0.010 | 0.60 | |
| CM 247 | 0.07 | 8.3 | Rem. | 10.0 | 0.5 | 9.5 | 3.2 | | 5.5 | 0.7 | | | 1.5 |

SINGLE CRYSTAL WELDING OF DIRECTIONALLY COMPACTED MATERIALS

CROSS REFERENCE TO RELATED APPLICATIONS

This application is the US National Stage of International Application No. PCT/EP2012/056739 filed Apr. 13, 2012 and claims benefit thereof, the entire content of which is hereby incorporated herein by reference. The International Application claims priority to the European application No. 11165301.0 EP filed May 9, 2011, the entire contents of which is hereby incorporated herein by reference.

FIELD OF INVENTION

The invention relates to a process for welding directionally solidified metallic materials.

BACKGROUND OF INVENTION

SX nickel-based superalloys reinforced with γ' cannot be subjected to build-up welding with fillers of the same type in overlapping welding tracks in one or more layers either by means of conventional welding processes or by high-energy processes (laser, electron beam). The problem is that a microstructure with misorientation already forms in the case of an individual welding track in the marginal region close to the surface. For the subsequent overlapping track, this means that the solidification front in this region has no available SX nucleus, and the region with misorientation (no SX microstructure) expands further in the overlapping region. Cracks are formed in this region.

For SX nickel-based superalloys reinforced with γ', the welding processes used to date are not able to homogeneously build up a weld metal by overlapping in one or more layers with an identical SX microstructure. In the case of a single track on an SX substrate, the local solidification conditions vary in such a manner that, depending on the position, dendritic growth is initiated proceeding from the primary roots or the secondary arms. In this case, of the various possible dendrite growth directions, the direction which prevails is the direction with the most favorable growth conditions, i.e. the direction with the smallest angle of inclination with respect to the temperature gradient. The cause of the formation of misorientations in the SX microstructure during the powder build-up welding of SX nickel-based superalloys reinforced with γ' has not yet been completely clarified. It is suspected that, when the dendrites meet one another from various growth directions, secondary arms may break away and serve as nuclei for the formation of a misoriented microstructure. In addition, powder particles which have not completely melted in the melt may serve as nuclei for the formation of a misoriented microstructure in the marginal region close to the surface. To solve this problem, a procedure which involves realizing growth conditions which favor only one growth direction for the dendrites is therefore proposed for the powder build-up welding of SX nickel-based superalloys reinforced with γ'. In addition, the procedure ensures that the powder particles are melted completely in the melt.

SUMMARY OF INVENTION

Therefore, it is an object of the invention to solve the problem mentioned above.

This object is achieved by a process as claimed in the independent claim.

To solve this technical problem relating to the formation of a non-single-crystal microstructure in the marginal region of a single track close to the surface, a procedure is proposed for build-up welding with laser radiation in which this problem does not arise or arises to such a small extent that overlapping in one or more layers is possible without the formation of cracks at room temperature.

The dependent claims list further advantageous measures which can be combined with one another, as desired, in order to obtain further advantages.

BRIEF DESCRIPTION OF DRAWINGS

FIG. 2 shows a gas turbine.

DETAILED DESCRIPTION OF INVENTION

The description and the figures represent only exemplary embodiments of the invention.

Figure 1:
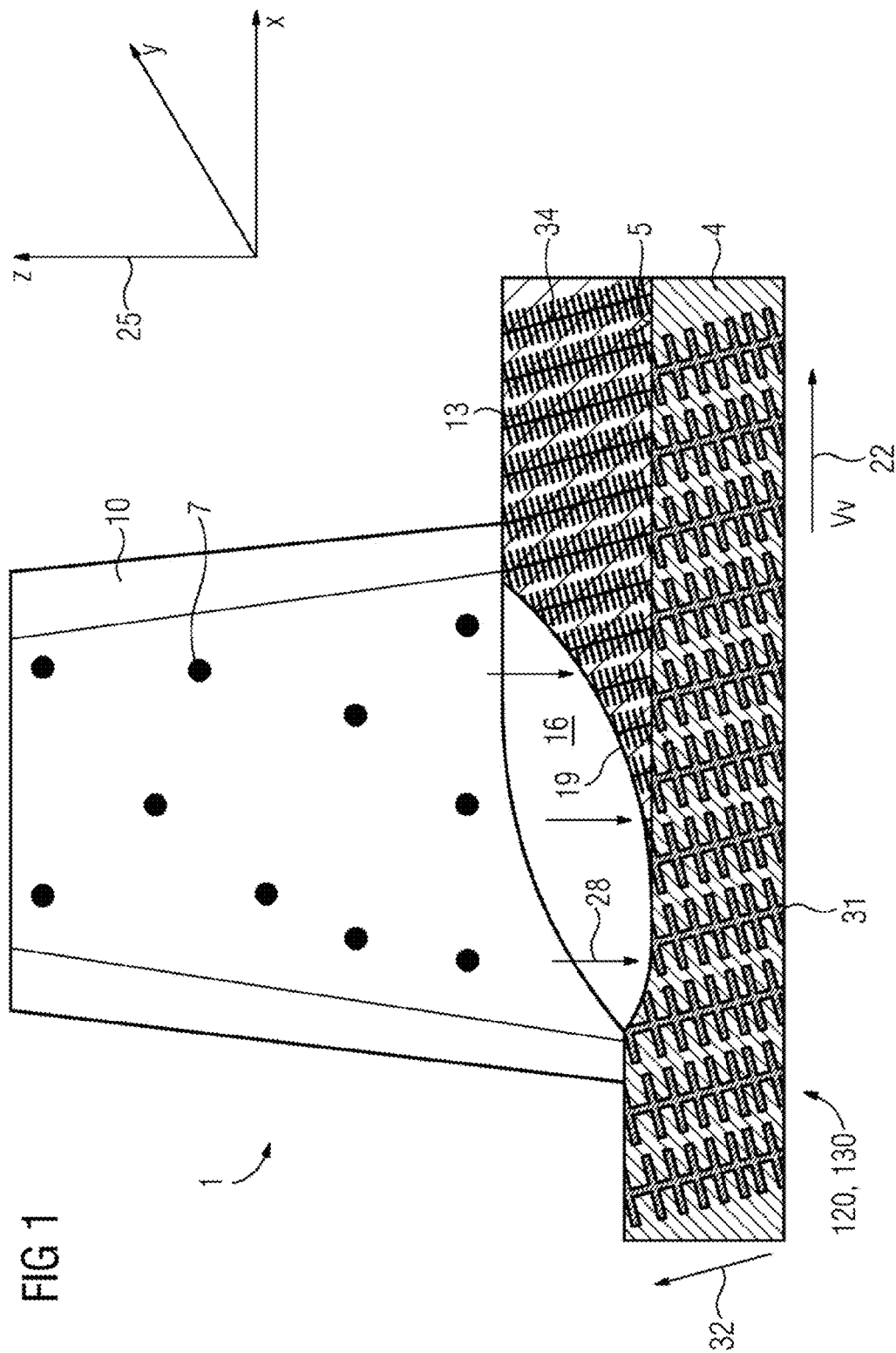
FIG. 1 shows a schematic course of the process.

FIG. 1 schematically shows the course of the process, with an apparatus 1.

Figure 4:
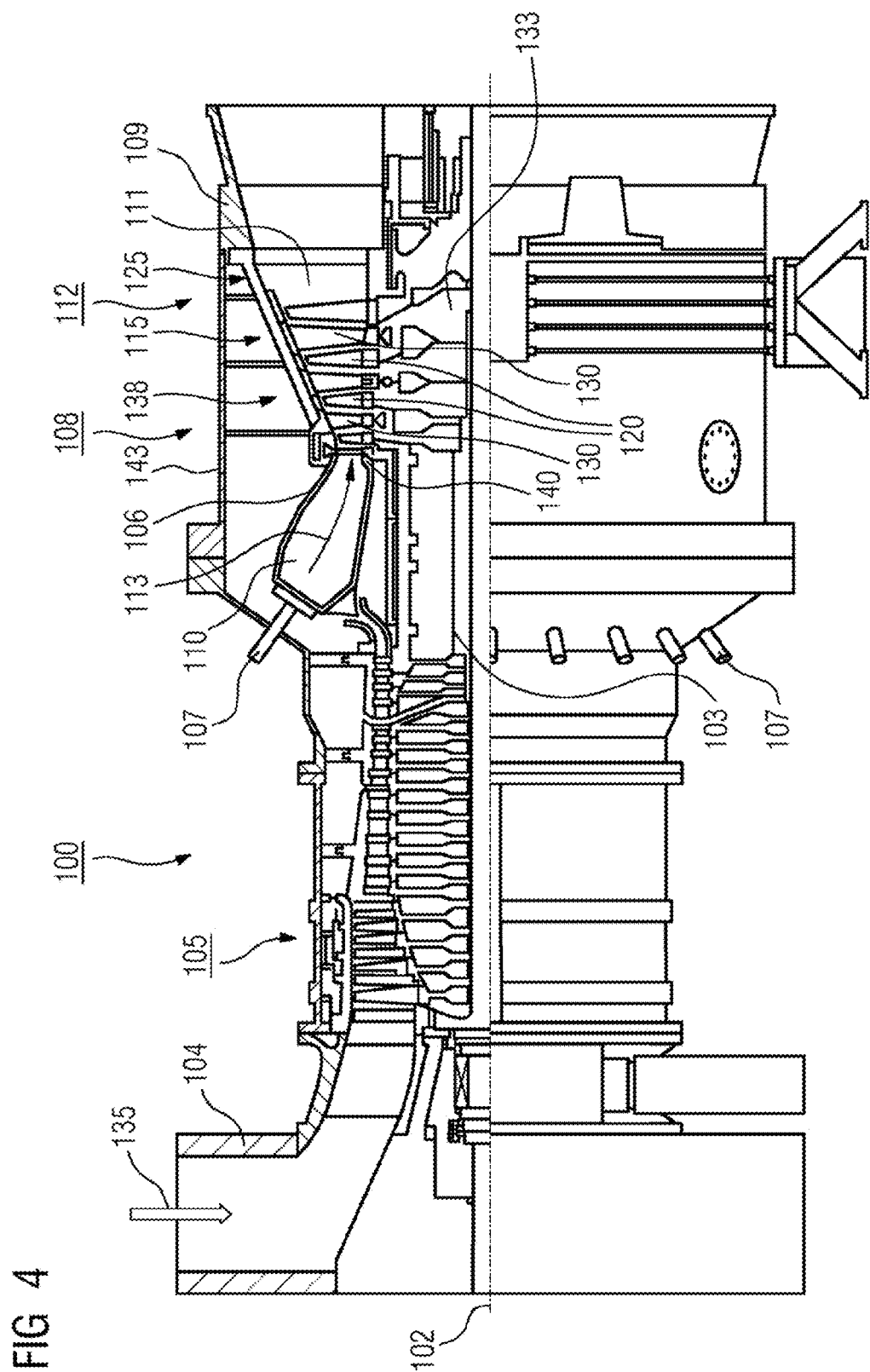
FIG. 4 shows a list of superalloys.

The component 120, 130 to be repaired has a substrate 4 made of a superalloy, in particular of a nickel-based superalloy as shown in FIG. 4. Very particularly, the substrate 4 consists of a nickel-based superalloy. The substrate 4 is repaired by applying new material 7, in particular by means of powder, to the surface 5 of the substrate 4 by build-up welding.

This is effected by supplying material 7 and a welding beam, preferably a laser beam 10 of a laser, which melts at least the supplied material 7 and preferably also parts of the substrate 4. Here, use is preferably made of powder. The diameter of the powder particles 7 is preferably so small that they can be melted completely by a laser beam and a sufficiently high temperature of the particles 7 results. In this respect, a melted region 16 and an adjoining solidification front 19 and, upstream thereof, an already resolidified region 13 are present on the substrate 4 during the welding.

The apparatus of the invention preferably comprises a laser (not shown) with a powder supply unit and a movement system (not shown), with which the laser beam interaction zone and the impingement region for the powder 7 on the substrate surface 5 can be moved. In this case, it is preferable that the component (substrate 4) is neither preheated nor overaged by means of heat treatment. That region on the substrate 4 which is to be reconstructed is preferably subjected to build-up welding in layers. The layers are preferably applied in a meandering manner, unidirectionally or bidirectionally, in which case the scan vectors of the meandering movements from layer to layer are preferably turned in each case by 90°, in order to avoid bonding errors between the layers. The dendrites 31 in the substrate 4 and the dendrites 34 in the applied region 13 are shown in FIG. 1.

A system of coordinates 25 is likewise shown. The substrate 4 moves relatively in the x direction 22 at the scanning speed $V_r$. The z temperature gradient $$\frac{\partial T}{\partial z}$$

28 is present on the solidification front 19.

The welding process is carried out with process parameters concerning feed rate $V_r$, laser power, beam diameter and powder mass flow which lead to a local orientation of the temperature gradient on the solidification front which is preferably smaller than 45° with respect to the direction of the dendrites 31 in the substrate 4. This ensures that exclusively that growth direction which continues the dendrite direction 32 in the substrate 4 is favored for the dendrites 34. This requires a beam radius which ensures that that part of the three-phase lines which delimits the solidification front 19 is covered completely by the laser beam.

The approximative condition for a suitable inclination of the solidification front 19 with respect to the dendrite direction 32 of the dendrites 31 in the substrate 4 is preferably the following:

$$\frac{\frac{1}{\lambda} * A * I_L}{\sqrt{\left(\frac{\partial T}{\partial x}(V_V)\right)^2 = \left(\frac{\partial T}{\partial y}(V_V)\right)^2 + \left(\frac{1}{\lambda} + A * I_L\right)^2}} \geq 0.707 = \cos(45°)$$

A: Degree of absorption of the substrate,
$I_L$: Laser intensity,
$V_V$: Scanning speed,
λ: Thermal conductivity of the substrate,
T: Temperature.

The condition gives rise to a process window, depending on the material, concerning the intensity of the laser radiation (approximate top hat), the beam radius relative to the powder jet focus, the feed rate $V_V$ and the powder mass flow.

The complete coverage of the melt with the laser radiation ensures, in the case of the coaxial procedure, a longer time of interaction between the powder particles and the laser radiation and a consequently higher particle temperature upon contact with the melt.

The particle diameter and therefore the predefined time of interaction should bring about a temperature level which is high enough for complete melting. Given an appropriate particle temperature and residence time in the melt, a sufficiently high temperature level of the melt should have the effect that the particles melt completely.

By virtue of the process parameters and mechanisms described above, the prerequisites for epitaxial single-crystal growth in the weld metal with an identical dendrite orientation in the substrate are ensured. Since only one dendrite growth direction normal to the surface is activated during the welding process, the subsequent flowing of the melt into the interdendritic space is facilitated during solidification, and the formation of hot cracks is avoided. This results in a weld quality which is acceptable for structural welding (e.g. for the purposes of repairing or joining in a region of the component subject to a high level of loading).

The relative speed $V_v$ is preferably between 30 mm/min and 100 mm/min, and is preferably 50 mm/min. The power is in the range of preferably 200 W to 500 W, and is very preferably 300 W, the laser beam on the surface having a diameter of 3 mm to 6 mm, preferably 4 mm. The mass feed rate is preferably 300 mg/min to 600 mg/min, preferably 400 mg/min.

Figure 5:
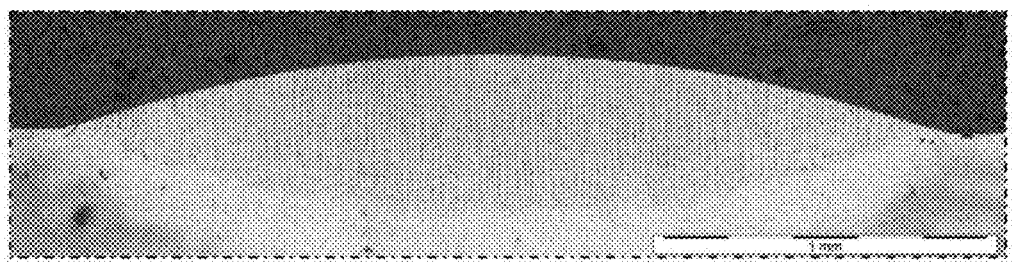
FIGS. 5 and 6 show welding beads.
Figure 6:

In comparison to the prior art, the criterion G″/v is not used or is used only temporarily for a single-crystal or columnar dendritic solidification (see work of M. Gäumann). In comparison to the prior art, the developed process adapts the aforementioned process parameters of laser beam diameter, laser power, movement speed, powder mass flow in such a way that the track (FIG. 5) or tracks (FIG. 6) subjected to build-up welding solidify entirely in single-crystal form with a dendrite orientation (see FIG. 5). This microstructure which is formed reduces the susceptibility to the formation of misorientated grains and therefore the formation of cracks by a continuous ductile interdendritic matrix also of the horizontal stresses during the build-up welding of multi-layered layers (see FIG. 6).

FIG. 2 shows, by way of example, a partial longitudinal section through a gas turbine 100. In the interior, the gas turbine 100 has a rotor 103 with a shaft 101 which is mounted such that it can rotate about an axis of rotation 102 and is also referred to as the turbine rotor. An intake housing 104, a compressor 105, a, for example, toroidal combustion chamber 110, in particular an annular combustion chamber, with a plurality of coaxially arranged burners 107, a turbine 108 and the exhaust-gas housing 109 follow one another along the rotor 103. The annular combustion chamber 110 is in communication with a, for example, annular hot-gas passage 111, where, by way of example, four successive turbine stages 112 form the turbine 108.

Each turbine stage 112 is formed, for example, from two blade or vane rings. As seen in the direction of flow of a working medium 113, in the hot-gas passage 111 a row of guide vanes 115 is followed by a row 125 formed from rotor blades 120. The guide vanes 130 are secured to an inner housing 138 of a stator 143, whereas the rotor blades 120 of a row 125 are fitted to the rotor 103 for example by means of a turbine disk 133. A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot-gas passage 111 past the guide vanes 130 and the rotor blades 120. The working medium 113 is expanded at the rotor blades 120, transferring its momentum, so that the rotor blades 120 drive the rotor 103 and the latter in turn drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield elements which line the annular combustion chamber 110, are subject to the highest thermal stresses.

To be able to withstand the temperatures which prevail there, they may be cooled by means of a coolant. Substrates of the components may likewise have a directional structure, i.e. they are in single-crystal form (SX structure) or have only longitudinally oriented grains (DS structure).

By way of example, iron-based, nickel-based or cobalt-based superalloys are used as material for the components, in particular for the turbine blade or vane 120, 130 and components of the combustion chamber 110. Superalloys of this type are known, for example, from EP 1 204 776 B1, EP 1 306 454, EP 1 319 729 A1, WO 99/67435 or WO 00/44949.

The blades or vanes 120, 130 may likewise have coatings protecting against corrosion (MCrAlX; M is at least one element selected from the group consisting of iron (Fe), cobalt (Co), nickel (Ni), X is an active element and stands for yttrium (Y) and/or silicon, scandium (Sc) and/or at least one rare earth element, or hafnium). Alloys of this type are known from EP 0 486 489 B1, EP 0 786 017 B1, EP 0 412 397 B1 or EP 1 306 454 A1.

It is also possible for a thermal barrier coating to be present on the MCrAlX, consisting for example of $ZrO_2$, $Y_2O_3$—$ZrO_2$, i.e. unstabilized, partially stabilized or fully stabilized by yttrium oxide and/or calcium oxide and/or magnesium oxide. Columnar grains are produced in the thermal barrier coating by suitable coating processes, such as for example electron beam physical vapor deposition (EB-PVD).

The guide vane 130 has a guide vane root (not shown here), which faces the inner housing 138 of the turbine 108, and a guide vane head which is at the opposite end from the guide vane root. The guide vane head faces the rotor 103 and is fixed to a securing ring 140 of the stator 143.

Figure 3:
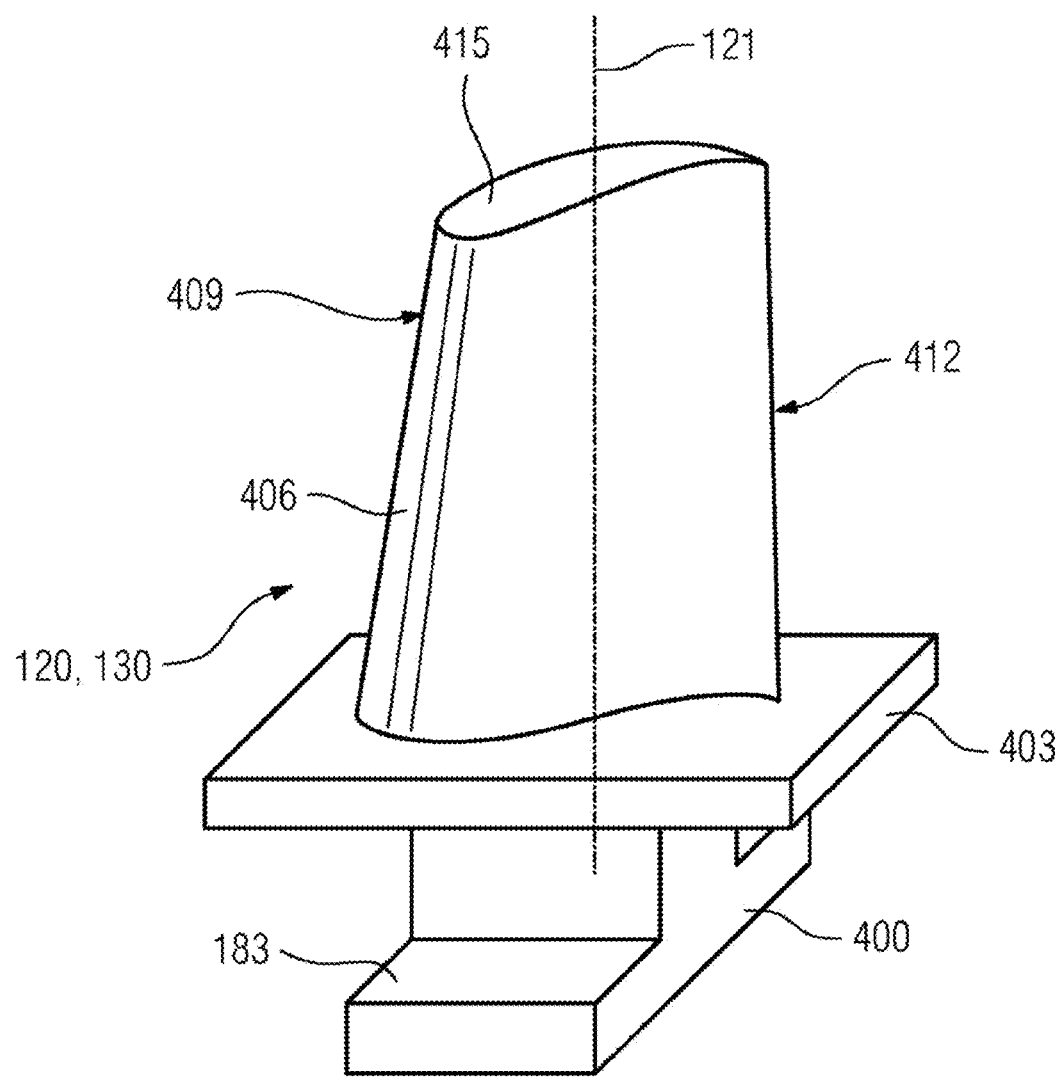
FIG. 3 shows a turbine blade or vane.

FIG. 3 shows a perspective view of a rotor blade 120 or guide vane 130 of a turbomachine, which extends along a longitudinal axis 121.

The turbomachine may be a gas turbine of an aircraft or of a power plant for generating electricity, a steam turbine or a compressor. The blade or vane 120, 130 has, in succession along the longitudinal axis 121, a securing region 400, an adjoining blade or vane platform 403 and a main blade or vane part 406 and a blade or vane tip 415. As a guide vane 130, the vane 130 may have a further platform (not shown) at its vane tip 415.

A blade or vane root 183, which is used to secure the rotor blades 120, 130 to a shaft or a disk (not shown), is formed in the securing region 400. The blade or vane root 183 is designed, for example, in hammerhead form. Other configurations, such as a fir-tree or dovetail root, are possible. The blade or vane 120, 130 has a leading edge 409 and a trailing edge 412 for a medium which flows past the main blade or vane part 406. In the case of conventional blades or vanes 120, 130, by way of example solid metallic materials, in particular superalloys, are used in all regions 400, 403, 406 of the blade or vane 120, 130. Superalloys of this type are known, for example, from EP 1 204 776 B1, EP 1 306 454, EP 1 319 729 A1, WO 99/67435 or WO 00/44949. The blade or vane 120, 130 may in this case be produced by a casting process, by means of directional solidification, by a forging process, by a milling process or combinations thereof.

Workpieces with a single-crystal structure or structures are used as components for machines which, in operation, are exposed to high mechanical, thermal and/or chemical stresses.

Single-crystal workpieces of this type are produced, for example, by directional solidification from the melt. This involves casting processes in which the liquid metallic alloy solidifies to form the single-crystal structure, i.e. the single-crystal workpiece, or solidifies directionally.

In this case, dendritic crystals are oriented along the direction of heat flow and form either a columnar crystalline grain structure (i.e. grains which run over the entire length of the workpiece and are referred to here, in accordance with the language customarily used, as directionally solidified) or a single-crystal structure, i.e. the entire workpiece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, and columnar crystal structures, which do have grain boundaries running in the longitudinal direction but do not have any transverse grain boundaries. This second form of crystalline structures is also described as directionally solidified microstructures (directionally solidified structures). Processes of this type are known from U.S. Pat. No. 6,024,792 and EP 0 892 090 A1.

The blades or vanes 120, 130 may likewise have coatings protecting against corrosion or oxidation e.g. (MCrAlX; M is at least one element selected from the group consisting of iron (Fe), cobalt (Co), nickel (Ni), X is an active element and stands for yttrium (Y) and/or silicon and/or at least one rare earth element, or hafnium (Hf)). Alloys of this type are known from EP 0 486 489 B1, EP 0 786 017 B1, EP 0 412 397 B1 or EP 1 306 454 A1. The density is preferably 95% of the theoretical density.

A protective aluminum oxide layer (TGO=thermally grown oxide layer) is formed on the MCrAlX layer (as an intermediate layer or as the outermost layer). The layer preferably has a composition Co-30Ni-28Cr-8Al-0.6Y-0.7Si or Co-28Ni-24Cr-10Al-0.6Y. In addition to these cobalt-based protective coatings, it is also preferable to use nickel-based protective layers, such as Ni-10Cr-12Al-0.6Y-3Re or Ni-12Co-21Cr-11Al-0.4Y-2Re or Ni-25Co-17Cr-10Al-0.4Y-1.5Re.

It is also possible for a thermal barrier coating, which is preferably the outermost layer, to be present on the MCrAlX, consisting for example of $ZrO_2$, $Y_2O_3$—$ZrO_2$, i.e. unstabilized, partially stabilized or fully stabilized by yttrium oxide and/or calcium oxide and/or magnesium oxide. The thermal barrier coating covers the entire MCrAlX layer.

Columnar grains are produced in the thermal barrier coating by suitable coating processes, such as for example electron beam physical vapor deposition (EB-PVD).

Other coating processes are possible, e.g. atmospheric plasma spraying (APS), LPPS, VPS or CVD. The thermal barrier coating may include grains that are porous or have micro-cracks or macro-cracks, in order to improve the resistance to thermal shocks. The thermal barrier coating is therefore preferably more porous than the MCrAlX layer.

Refurbishment means that after they have been used, protective layers may have to be removed from components 120, 130 (e.g. by sand-blasting). Then, the corrosion and/or oxidation layers and products are removed. If appropriate, cracks in the component 120, 130 are also repaired. This is followed by recoating of the component 120, 130, after which the component 120, 130 can be reused.

The blade or vane 120, 130 may be hollow or solid in form. If the blade or vane 120, 130 is to be cooled, it is hollow and may also have film-cooling holes 418 (indicated by dashed lines).

The invention claimed is:
1. A process for a directional solidification of a weld seam during build-up welding of a substrate of a component, wherein the substrate is directionally solidified and comprises dendrites, and wherein the dendrites extend in a substrate dendrite direction, the process comprising:
    performing a build up welding process on a surface of the substrate by repeated application, melting, and resolidification of at least a powder material,
    wherein the build up welding is done according to process parameters comprising a feed rate, a laser power, a diameter of welding beam, and powder mass flow such that the process parameters lead to a local orientation of a temperature gradient on a solidification front during the process, and wherein the local orientation of the temperature gradient on the solidification front is smaller than 45° with respect to the substrate dendrite direction of the dendrites in the substrate.

2. The process as claimed in claim 1, wherein the feed rate is between 30 mm/min and 100 mm/min.

3. The process as claimed in claim 1, wherein the laser power is between 200 W and 500 W.

4. The process as claimed in claim 1, wherein the diameter of the welding beam on a surface of the substrate is between 3 mm and 6 mm.

5. The process as claimed in claim 1, wherein a feed rate of the mass flow is between 300 mg/min and 600 mg/min.

6. The process as claimed in claim 1, wherein a melt which is generated by supply of powder and/or material of the substrate is formed on and in the substrate, wherein the melt is covered completely by the welding beam or by a laser beam, and wherein the melt is overlapped.

7. The process as claimed in claim 6, wherein the supply of the powder is applied in layers.

8. The process as claimed in claim 1, wherein the substrate comprises a nickel-based superalloy, or comprises columnar grains, or comprises a single-crystal microstructure.

9. The process as claimed in claim 1, wherein a diameter of powder particles is so small that the powder particles melt completely in the welding beam and have a high temperature.

10. The process as claimed in claim 9, wherein the temperature of the melted powder particles is 20° C. above a melting temperature of the powder particles.

11. The process as claimed in claim 1, wherein the welding beam comprises a laser beam.

12. The process as claimed in claim 1, wherein a condition for the local orientation of the temperature gradient on the solidification front comprises:

$$\frac{\frac{1}{\lambda} * A * I_L}{\sqrt{\left(\frac{\partial T}{\partial x}(V_V)\right)^2 = \left(\frac{\partial T}{\partial y}(V_V)\right)^2 + \left(\frac{1}{\lambda} + A * I_L\right)^2}} \geq 0.707 = \cos(45°)$$

A: Degree of absorption of the substrate, $I_L$: Welding beam intensity, $V_V$: Feed rate, $\lambda$: Thermal conductivity of the substrate, T: Temperature.

13. A process for a directional solidification of a weld seam during build-up welding of a substrate of a component, wherein the substrate is directionally solidified and comprises dendrites, and wherein the dendrites extend in a substrate dendrite direction, the process comprising:

depositing a powder material on the substrate;

subjecting at least the powder material to an amount of energy effective to melt the powder material;

solidifying the molten material to provide a directionally solidified weld;

wherein the depositing and subjecting steps are done according to process parameters selected from the group consisting of a feed rate, a laser power, a diameter of welding beam, powder jet focus, a powder mass flow, and combinations thereof such that the process produces a local orientation of a temperature gradient on a solidification front, wherein a condition for the local orientation of the temperature gradient on the solidification front comprises:

$$\frac{\frac{1}{\lambda} * A * I_L}{\sqrt{\left(\frac{\partial T}{\partial x}(V_V)\right)^2 = \left(\frac{\partial T}{\partial y}(V_V)\right)^2 + \left(\frac{1}{\lambda} + A * I_L\right)^2}} \geq 0.707 = \cos(45°)$$

A: Degree of absorption of the substrate, $I_L$: Welding beam intensity, $V_V$: Feed rate, $\lambda$: Thermal conductivity of the substrate, T: Temperature.

14. The method of claim 13, further comprising melting a portion of the substrate during the subjecting step.

* * * * *